US011990482B2

(12) United States Patent
Tang

(10) Patent No.: US 11,990,482 B2
(45) Date of Patent: May 21, 2024

(54) ARRAY SUBSTRATE AND ELECTRONIC DEVICE

(71) Applicant: WUHAN CHINA STAR OPTOELECTRONICS TECHNOLOGY CO., LTD., Hubei (CN)

(72) Inventor: Wei Tang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/607,875

(22) PCT Filed: Sep. 18, 2021

(86) PCT No.: PCT/CN2021/119340
§ 371 (c)(1),
(2) Date: Oct. 30, 2021

(87) PCT Pub. No.: WO2023/035318
PCT Pub. Date: Mar. 16, 2023

(65) Prior Publication Data
US 2024/0030237 A1 Jan. 25, 2024

(30) Foreign Application Priority Data
Sep. 9, 2021 (CN) .......................... 202111057223.8

(51) Int. Cl.
H01L 27/12 (2006.01)

(52) U.S. Cl.
CPC ................ H01L 27/1244 (2013.01)

(58) Field of Classification Search
None
See application file for complete search history.

(56) References Cited

U.S. PATENT DOCUMENTS

2010/0002178 A1* 1/2010 Ninomiya ......... G02F 1/136259
349/138
2013/0077034 A1* 3/2013 Jung ................... G02F 1/13458
349/122
2016/0320882 A1* 11/2016 Kim ..................... G06F 3/0416

FOREIGN PATENT DOCUMENTS

CN 105161505 A 12/2015
CN 105807523 A 7/2016
(Continued)

OTHER PUBLICATIONS

Chinese Office Action issued in corresponding Chinese Patent Application No. 202111057223.8 dated Apr. 1, 2022, pp. 1-9.
(Continued)

Primary Examiner — Bilkis Jahan
(74) Attorney, Agent, or Firm — PV IP PC; Wei Te Chung; Zhigang Ma

(57) ABSTRACT

An array substrate and an electronic device are disclosed. The electronic device includes a display panel including an array substrate. The array substrate includes a first insulating layer provided with a plurality of first via holes, a second insulating layer provided with a plurality of second via holes, and a second electrode layer includes a second electrode. An orthographic projection of at least one of the second via hole or the second electrode on the substrate is staggered from an orthographic projection of the first via hole on the substrate, so that a short between the first electrode and the second electrode can be prevented.

20 Claims, 6 Drawing Sheets

(56) References Cited

FOREIGN PATENT DOCUMENTS

| | | |
|---|---|---|
| CN | 106855670 A | 6/2017 |
| CN | 110034131 A | 7/2019 |
| CN | 111430373 A | 7/2020 |
| CN | 111505877 A | 8/2020 |
| CN | 112882295 A | 6/2021 |
| JP | 2008064954 A | 3/2008 |

OTHER PUBLICATIONS

International Search Report in International application No. PCT/CN2021/119340, dated Jun. 8, 2022.
Written Opinion of the International Searching Authority in International application No. PCT/CN2021/119340, dated Jun. 8, 2022.

* cited by examiner

ARRAY SUBSTRATE AND ELECTRONIC DEVICE

RELATED APPLICATIONS

This application is a Notional Phase of PCT Patent Application No. PCT/CN2021/119340 having international filing date of Sep. 18, 2021, which claims the benefit of priority of Chinese Patent Application No. 202111057223.8 filed on Sep. 9, 2021. The contents of the above applications are all incorporated by reference as if fully set forth herein in their entirety.

BACKGROUND OF INVENTION

1. Field of Invention

The present invention relates to a technical field of displays, and particularly to an array substrate and an electronic device.

2. Related Art

In recent years, with development of electronic technologies, mobile display electronic devices, such as mobile phones and tablets have become indispensable social media and information storage carriers in our daily lives. For large-sized electronic devices, due to large horizontal width of display panels, uneven display is prone to appear in a middle and periphery of the display area. Current electronic devices are provided with common signal lines in array substrates, and the common signal lines configured in display areas are connected to common electrodes. In this way, so that the common electrodes can receive common electrode signals timely and uniformly, thereby improving a problem of uneven display of the display panels.

As shown in FIGS. 1a and 1b, which are schematic structural views of a conventional array substrate, the conventional array substrate includes a barrier layer 11, a gate insulating layer 12, a common signal line 13, an interlayer dielectric layer 14, a conductive electrode 15, a planarization layer 16, a common electrode 17, a passivation layer 18, and a pixel electrode 19 arranged in sequence. The common signal line 13 is connected to the conductive electrode 15 through a first via hole 141 formed in the interlayer dielectric layer 14, and the common electrode 17 is connected to the conductive electrode 15 through a second via hole 161 formed in the planarization layer 16. The second via hole 161 is located on the first via hole 141 and exposes the first via hole 141 and the conductive electrode 15 formed in the first via hole 141. A junction a of a sidewall of the first via hole 141 and a surface of the interlayer dielectric layer 14 will form a step corner with a certain angle. Electrostatic discharge in a subsequent manufacturing process may cause the conductive electrode 15 above the step corner of the junction a to melt. The melted conductive electrode 15 is pressed against the common electrode 17 and the passivation layer 18 above the common electrode 17, and breaks the passivation layer 18, causing the passivation layer 18 at the junction a to produce cracks as shown in FIG. 1b. The common electrode 17 located under the passivation layer 18 is precipitated through the cracks of the passivation layer 18, and forms a short with the pixel electrode 19 above the passivation layer 18. As a result, the array substrate and an electronic device will display problematic images, such as clusters of dark spots or horizontal lines during a lighting test.

In summary, current array substrates and electronic devices have a problem of shorts occurred between common electrodes and pixel electrodes. Therefore, it is imperative to provide an array substrate and an electronic device to improve the above-mentioned defects.

SUMMARY OF INVENTION

The embodiments of the present application provide an array substrate and an electronic device to solve a problem of a short occurring between common electrodes and pixel electrodes in current array substrates and electronic devices.

An embodiment of the present application provides an array substrate, comprising a substrate; a first metal layer disposed on the substrate and comprising a plurality of common signal lines; a first insulating layer covering the first metal layer and provided with a plurality of first via holes; a second metal layer disposed on a side of the first insulating layer away from the first metal layer and comprising a plurality of conductive electrodes, wherein the conductive electrodes are connected to the common signal lines through the first via holes; a second insulating layer disposed on the side of the first insulating layer away from the first metal layer and covering the second metal layer, and a plurality of second via holes defined on the second insulating layer; a first electrode layer disposed on a side of the second insulating layer away from the second metal layer and comprising a plurality of first electrodes, wherein the first electrodes are connected to the conductive electrodes through the second via holes; a second electrode layer disposed on a side of the first electrode layer away from the second insulating layer and comprising a plurality of second electrodes; wherein an orthographic projection of at least one of the second via hole or the second electrode on the substrate is staggered from an orthographic projection of the first via hole on the substrate.

According to an embodiment of the present application, the orthographic projection of the first via hole on the substrate and the orthographic projection of the second via hole on the substrate are completely staggered from each other, and the orthographic projection of the first via hole on the substrate and the orthographic projection of the second electrode on the substrate at least partially overlap.

According to an embodiment of the present application, the orthographic projection of the second via hole on the substrate and the orthographic projection of the second electrode on the substrate are completely staggered from each other or at least partially overlap.

According to an embodiment of the present application, each of the conductive electrodes comprises a body portion disposed in the first via hole and connected to one of the common signal lines, wherein the second insulating layer covers the body portion and fills the first via hole; and an extension portion connected to the body portion and disposed on the side of the first insulating layer away from the first metal layer, wherein the second via hole exposes the extension portion, and the first electrode is connected to the extension portion.

According to an embodiment of the present application, the orthographic projection of the first via hole on the substrate and the orthographic projection of the second via hole on the substrate are completely staggered from each other, and the orthographic projection of the first via hole on the substrate and the orthographic projection of the second electrode on the substrate are completely staggered from each other.

According to an embodiment of the present application, the orthographic projection of the second via hole on the substrate and the orthographic projection of the second electrode on the substrate are completely staggered from each other or at least partially overlap.

According to an embodiment of the present application, each of the conductive electrodes comprises a body portion disposed in the first via hole and connected to one of the common signal lines, wherein the second insulating layer covers the body portion and fills the first via hole; and an extension portion connected to the body portion and disposed on the side of the first insulating layer away from the first metal layer, wherein the second via hole exposes the extension portion, and the first electrode is connected to the extension portion.

According to an embodiment of the present application, the orthographic projection of the first via hole on the substrate and the orthographic projection of the second via hole on the substrate at least partially overlap, and the orthographic projection of the first via hole on the substrate and the orthographic projection of the second electrode on the substrate are completely staggered from each other.

According to an embodiment of the present application, the orthographic projection of the second via hole on the substrate and the orthographic projection of the second electrode on the substrate are completely staggered from each other or at least partially overlap.

According to an embodiment of the present application, the array substrate comprises a first area, and the second electrodes are arranged in an array in the first area; wherein the second metal layer comprises a common voltage signal line, and the common voltage signal line surrounds an outer periphery of the first area and is connected to the common signal lines through a plurality of third via holes extending through the first insulating layer.

According to an embodiment of the present application, the array substrate further comprises a plurality of gate signal lines and a plurality of data signal lines; wherein the common signal lines and the gate signal lines are disposed in a same layer, and the common voltage signal line and the data signal lines are disposed in a same layer.

An embodiment of the present application further provides an electronic device, comprising a display panel, the display panel comprising an array substrate, and the array substrate comprising a substrate; a first metal layer disposed on the substrate and comprising a plurality of common signal lines; a first insulating layer covering the first metal layer and provided with a plurality of first via holes; a second metal layer disposed on a side of the first insulating layer away from the first metal layer and comprising a plurality of conductive electrodes, wherein the conductive electrodes are connected to the common signal lines through the first via holes; a second insulating layer disposed on the side of the first insulating layer away from the first metal layer and covering the second metal layer, and a plurality of second via holes defined on the second insulating layer; a first electrode layer disposed on a side of the second insulating layer away from the second metal layer and comprising a plurality of first electrodes, wherein the first electrodes are connected to the conductive electrodes through the second via holes; a second electrode layer disposed on a side of the first electrode layer away from the second insulating layer and comprising a plurality of second electrodes; wherein an orthographic projection of at least one of the second via hole or the second electrode on the substrate is staggered from an orthographic projection of the first via hole on the substrate.

According to an embodiment of the present application, the orthographic projection of the first via hole on the substrate and the orthographic projection of the second via hole on the substrate are completely staggered from each other, and the orthographic projection of the first via hole on the substrate and the orthographic projection of the second electrode on the substrate at least partially overlap.

According to an embodiment of the present application, the orthographic projection of the second via hole on the substrate and the orthographic projection of the second electrode on the substrate are completely staggered from each other or at least partially overlap.

According to an embodiment of the present application, each of the conductive electrodes comprises a body portion disposed in the first via hole and connected to one of the common signal lines, wherein the second insulating layer covers the body portion and fills the first via hole; and an extension portion connected to the body portion and disposed on the side of the first insulating layer away from the first metal layer, wherein the second via hole exposes the extension portion, and the first electrode is connected to the extension portion.

According to an embodiment of the present application, the orthographic projection of the first via hole on the substrate and the orthographic projection of the second via hole on the substrate are completely staggered from each other, and the orthographic projection of the first via hole on the substrate and the orthographic projection of the second electrode on the substrate are completely staggered from each other.

According to an embodiment of the present application, the orthographic projection of the second via hole on the substrate and the orthographic projection of the second electrode on the substrate are completely staggered from each other or at least partially overlap.

According to an embodiment of the present application, each of the conductive electrodes comprises a body portion disposed in the first via hole and connected to one of the common signal lines, wherein the second insulating layer covers the body portion and fills the first via hole; and an extension portion connected to the body portion and disposed on the side of the first insulating layer away from the first metal layer, wherein the second via hole exposes the extension portion, and the first electrode is connected to the extension portion.

According to an embodiment of the present application, the orthographic projection of the first via hole on the substrate and the orthographic projection of the second via hole on the substrate at least partially overlap, and the orthographic projection of the first via hole on the substrate and the orthographic projection of the second electrode on the substrate are completely staggered from each other.

According to an embodiment of the present application, the orthographic projection of the second via hole on the substrate and the orthographic projection of the second electrode on the substrate are completely staggered from each other or at least partially overlap.

The embodiments of the present application have advantageous effects as follows: the embodiments of the present application provide an array substrate and an electronic device. The electronic device includes the array substrate. The array substrate includes a substrate, a first metal layer, a first insulating layer, a second metal layer, a second insulating layer, a first electrode layer, and a second electrode layer all sequentially stacked. The first metal layer includes a plurality of common signal lines, and the first insulating layer covers the first metal layer. A plurality of first via holes are formed in the first insulating layer. The second metal layer is arranged on a side of the first insulating layer away from the first metal first electrode layer and includes a plurality of conductive electrodes. The conductive electrodes are connected to the common signal lines through the first via holes. The second insulating layer is disposed on the side of the first insulating layer away from the first metal layer and covers the second metal layer, and a plurality of second via holes are formed in the second insulating layer. The first electrode layer is disposed on a side of the second insulating layer away from the second metal layer and includes a first electrode. The first electrode is connected to the conductive electrodes through the second via holes. The second electrode layer is disposed on a side of the first electrode layer away from the second insulating layer and includes a second electrode. An orthographic projection of at least one of the second via hole or the second electrode on the substrate is staggered from an orthographic projection of the first via hole on the substrate, thereby preventing cracks from occurring in an insulating layer between the first electrode layer and the second electrode layer, or ensuring that the second electrode would not occur above the first electrode precipitated through the cracks between the first electrode layer and the second electrode layer, so that a short between the first electrode and the second electrode can be prevented.

BRIEF DESCRIPTION OF DRAWINGS

In order to illustrate the technical solutions more clearly in the embodiments of the present invention, the following briefly introduces the accompanying drawings for describing the embodiments. Apparently, the accompanying drawings in the following description show merely some embodiments of the present invention, and a person skilled in the art may still derive other drawings from these accompanying drawings without creative efforts.

DESCRIPTION OF PREFERRED EMBODIMENTS

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

The disclosure will be further described below in conjunction with the drawings and specific embodiments:

The embodiments of the present application provide an array substrate and an electronic device. The electronic device includes a display panel, and the display panel includes an array substrate. The electronic device can be an in-vehicle display terminal, such as an in-vehicle display, a driving recorder, etc. The electronic device may also be a mobile terminal, such as a smart phone, a tablet computer, a notebook computer, etc., or a wearable terminal, such as a smart watch, a smart bracelet, smart glasses, an augmented reality device, etc. The electronic device may also be a fixed terminal, such as a desktop computer, a television (TV), etc., or an in-vehicle display terminal, such as an in-vehicle display or a driving recorder.

Figure 1A:
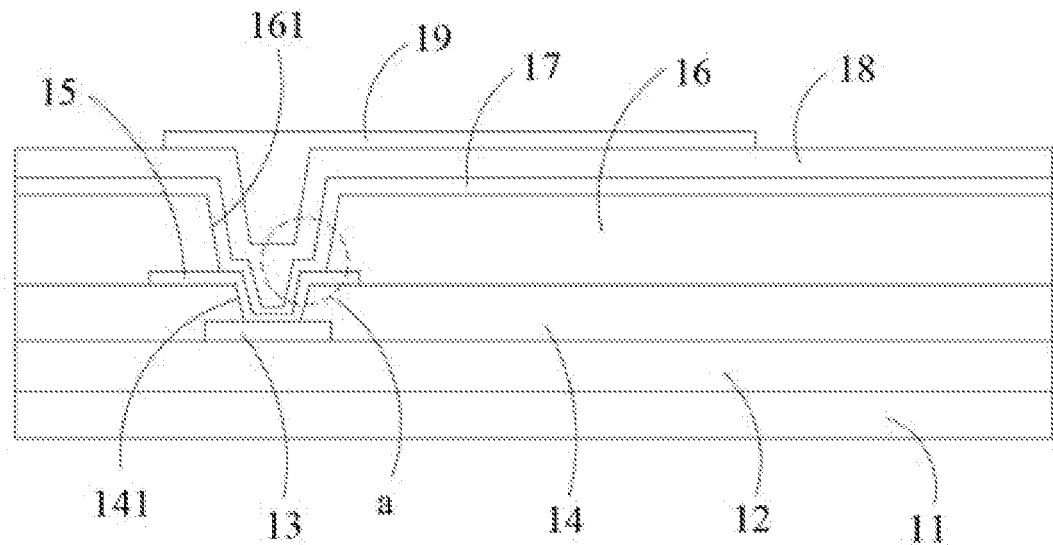
FIG. 1a is a schematic structural view of a conventional array substrate.
Figure 1B:
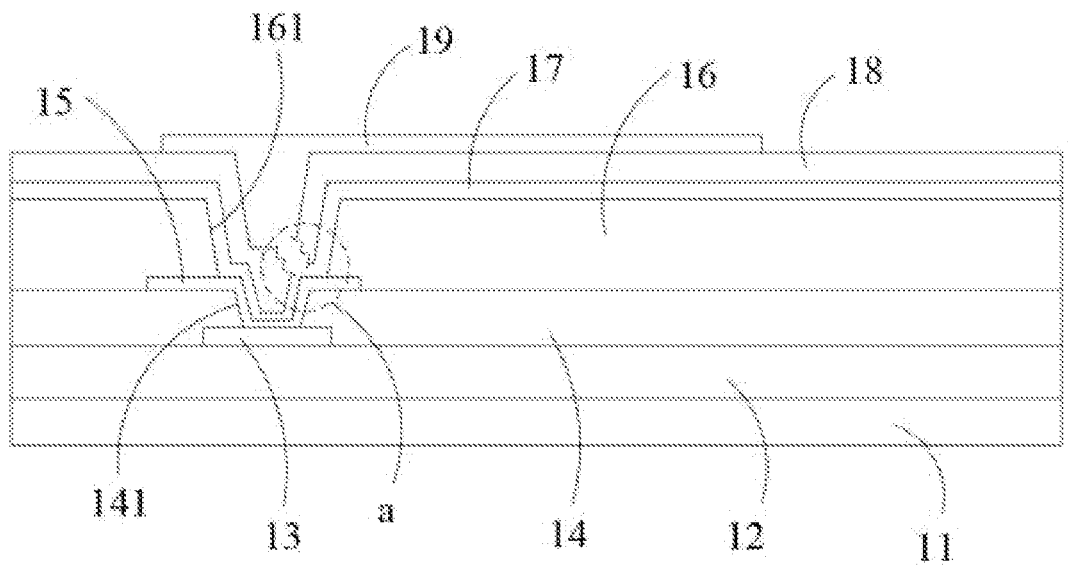
FIG. 1b is a schematic structural view of a conventional array substrate.
Figure 2:
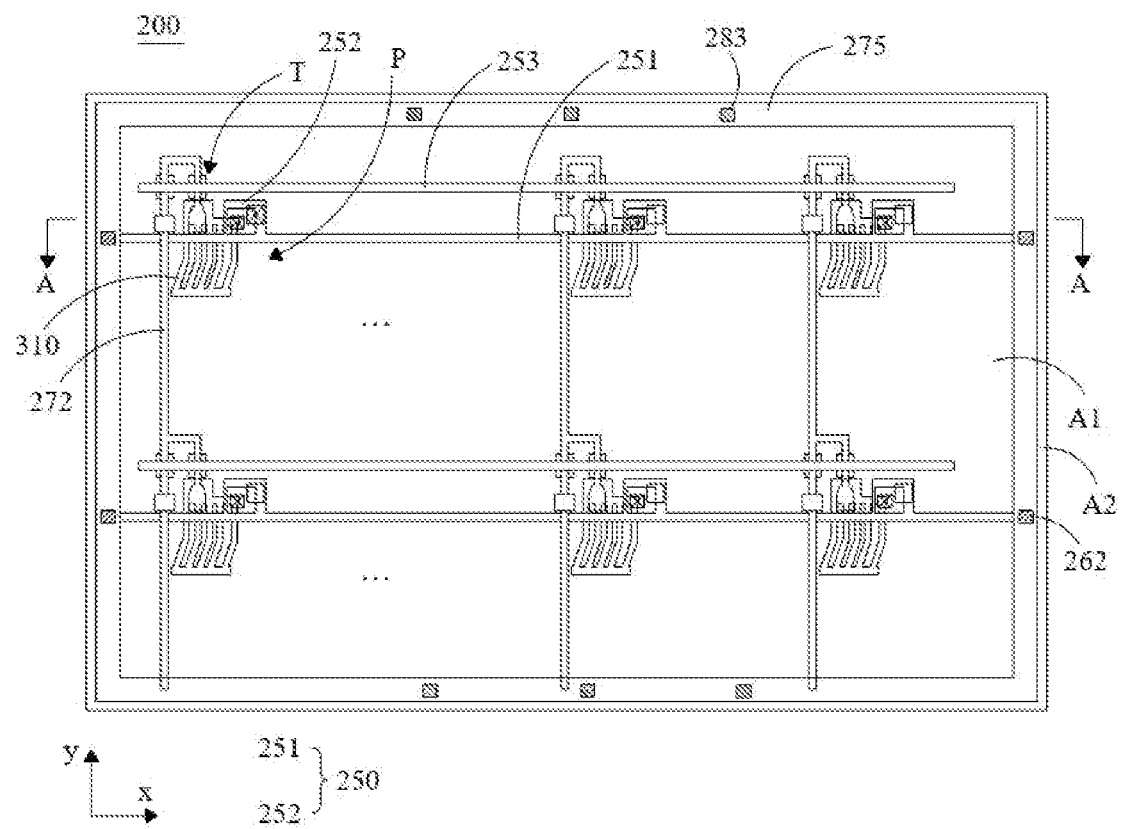
FIG. 2 is a schematic structural plan view of an array substrate provided by an embodiment of the present application.

As shown in FIG. 2, FIG. 2 is a schematic structural plan view of an array substrate provided by an embodiment of the present application. The array substrate 200 includes a substrate 20 and sub-pixel units P disposed in an array and arranged in multiple rows and columns on the substrate 20. Each of the sub-pixel units P is correspondingly configured with a thin-film transistor T and a second electrode 310, wherein the second electrode 310 is a pixel electrode. The array substrate 200 further has a plurality of gate signal lines 253 extending in a first direction x and a plurality of data signal lines 272 extending in a second direction y. Each of the gate signal lines 253 is connected to gate electrodes of the thin-film transistors T of a corresponding row of the sub-pixel units P. Each of the data signal lines 272 is connected to drain electrodes of the thin-film transistors T of a corresponding column of the sub-pixel units P.

Figure 3:
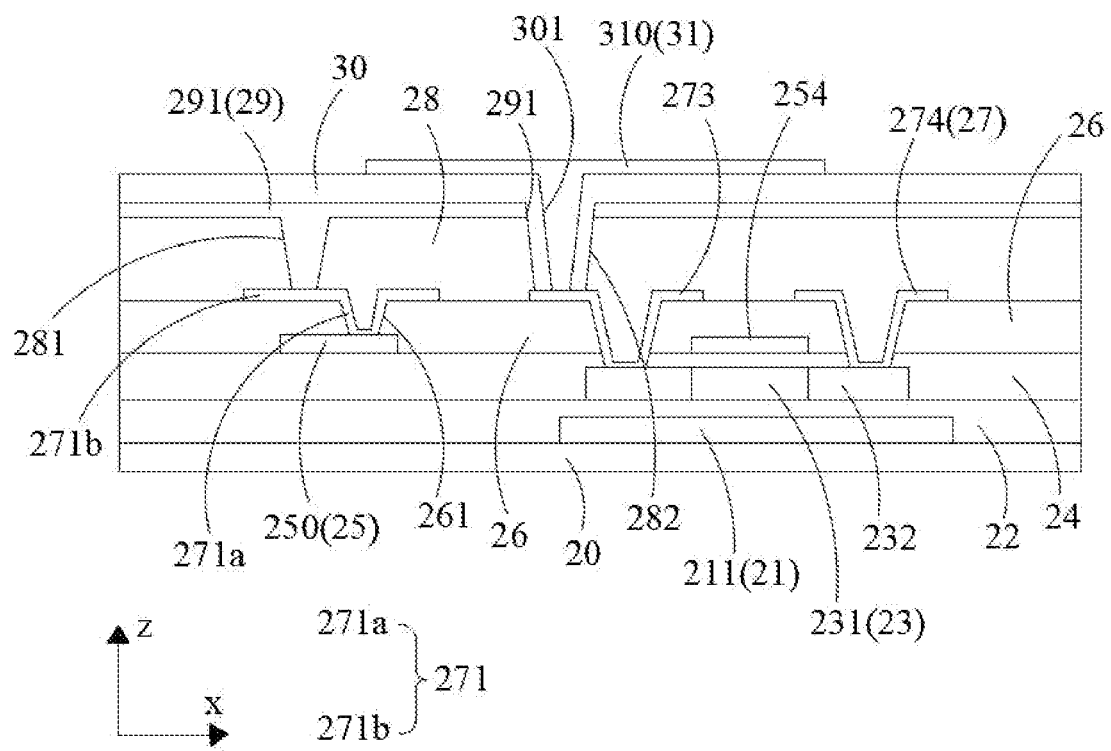
FIG. 3 is a schematic cross-sectional view of a first type of an array substrate taken along line A-A provided by an embodiment of the present application.

As shown in FIG. 3, FIG. 3 is a schematic cross-sectional view of a first type of an array substrate taken along line A-A provided by an embodiment of the present application. The array substrate 200 includes the substrate 20 and a light shielding layer 21, a barrier layer 22, an active layer 23, and a gate insulating layer 24 sequentially laminated on the substrate 20.

The light shielding layer 21 includes a plurality of patterned light shielding patterns 211, and a material of the light shielding layer 21 includes any one of a metallic material or a non-metallic material which does not transmit light and absorbs light. The light shielding patterns 211 are aligned with the active layer 23. The light shielding patterns 211 are configured to shield the active layer 23 to prevent ambient light or internal light from irradiating the active layer 23 through a side of the substrate 20 to cause electrical performance of the active layer 23 to decrease, thereby ensuring the electrical performance of the active layer 23.

The barrier layer 22 is disposed on the substrate 20 and covers the light shielding layer 21, and is configured to prevent external moisture or oxygen from corroding the thin-film transistors and other devices in the array substrate 200 through the side of the substrate 20.

The active layer 23 is disposed on a side of the barrier layer 22 away from the substrate 20 and includes a channel portion 231 and a conductive portion 232 connected to opposite ends of the channel portion 231. The gate insulating layer 24 is disposed on the side of the barrier layer 22 away from the substrate 20 and covers the active layer 23.

The array substrate 200 further includes a first metal layer 25, a first insulating layer 26, a second metal layer 27, a second insulating layer 28, a first electrode layer 29, a third insulating layer 30, and a second electrode layer 31 all sequentially disposed on the gate insulating layer 24 in a stacked arrangement.

Referring to FIG. 2 in combination FIG. 3, the first metal layer 25 includes a plurality of common signal lines 250. Each of the common signal lines 250 includes a main portion 251 and a plurality of connecting portions 252. The main portion 251 is elongated and extends in a first direction x. The main portions 251 of the common signal lines 250 are spaced apart from each other in a second direction y. Each of the connecting portions 252 is a block electrode. The connecting portions 252 are connected to a same side of the main portion 251, respectively, and are arranged at intervals in the first direction x.

In the embodiment of the present application, the gate signal lines 253, gate electrodes 254, and the common signal lines 250 are arranged on the same layer, that is, the gate signal lines 253 and the common signal lines 250 are both disposed in the first metal layer 25 and can be prepared by a same process. The common signal lines 250 and the gate signal lines 253 both extend in the first direction x and are spaced apart from each other in the second direction y. In practical applications, the gate signal lines 253 and the gate electrodes 254 are not limited to be provided in the first metal layer 25, but can also be provided in other metal layers on a side of the first metal layer 25 close to or far from the substrate 20, which is not limited here.

The first insulating layer 26 is disposed on the side of the barrier layer 22 away from the substrate 20 and covers the first metal layer 25. The first insulating layer 26 is an interlayer dielectric layer (ILD) and is composed of a silicon oxide layer and a silicon nitride layer stacked together. In practical applications, the first insulating layer 26 may also be a single-layer or a multilayer structure formed of any one of silicon nitride or silicon oxide or other insulating materials.

A plurality of first via holes 261 are formed in the first insulating layer 26. Each of the first via holes 261 extends through the first insulating layer 26 in the third direction z and exposes the connection portion 252 of the common signal line 250 located at a bottom of the first insulating layer 26.

The second metal layer 27 is disposed on a side of the first insulating layer 26 away from the first metal layer 25. The second metal layer 27 includes a plurality of conductive electrodes 271. Each of the conductive electrodes 271 is connected to a corresponding one of the common signal lines 250 through the first via hove 261.

Specifically, the conductive electrode 271 is a block electrode. An orthographic projection area of the conductive electrode 271 on the substrate 20 is larger than an orthographic projection area of the first via hole 261 on the substrate 20. The conductive electrode 271 is connected to the connecting portion 252 of the common signal line 250 through the first via hole 261 and is configured for receiving a common voltage signal transmitted by the common signal line 250.

In the embodiment of the present application, the data signal lines 272, the source electrodes 273, and the drain electrodes 274 may be arranged on a same layer as the conductive electrode 271. That is, the data signal lines 272, the source electrodes 273, the drain electrodes 274, and the conductive electrodes 271 are all disposed in the second metal layer 27. The conductive electrodes 271 can be formed together with the data signal lines 272, the source electrodes 273, and the drain electrodes 274 by a same process. In practical applications, the data signal lines 272, the source electrodes 273, and the drain electrodes 274 are not limited to being arranged in the second metal layer 27, but can also be arranged in other metal layers on a side of the second metal layer 27 close to or far from the substrate 20, which is not limited here.

The second insulating layer 28 is a planarization layer and is disposed on a side of the first insulating layer 26 away from the substrate 20 and covers the second metal layer 27. A plurality of second via holes 281 are formed in the second insulating layer 28. Each of the second via holes 281 extends through the second insulating layer 28 in the third direction z and exposes the conductive electrode 271 located at a bottom of the second insulating layer 28.

A plurality of fourth via holes 282 are formed in the second insulating layer 28. Each of the fourth via holes 282 extends through the second insulating layer 28 in the third direction z and exposes the source electrode 273 located at the bottom of the second insulating layer 28.

The first electrode layer 29 is disposed on a side of the second insulating layer 28 away from the second metal layer 27, and the first electrode layer 29 includes a first electrode 291. The first electrode 291 is a common electrode. The first electrode 291 can be disposed flat on the second insulating layer 28 and is connected to the conductive electrode 271 through the second via 281 in the second insulating layer 28, thereby receiving the common voltage signal transmitted by the common signal line 250. A fifth via 292 is further formed in the first electrode layer 29. The fifth via hole 292 is laminated directly on the fourth via hole 282 to expose the source electrode 273.

The third insulating layer 30 is a passivation layer (PV) and is disposed on a side of the first electrode layer 29 away from the second insulating layer 28, and covers the first electrode layer 29. The third insulating layer 30 also fills the fourth via hole 282 and the fifth via hole 292. A plurality of sixth via holes 301 are formed in the third insulating layer 30. Each of the sixth via holes 301 is disposed directly on the fifth via hole 292 and the fourth via hole 282, and extends through the third insulating layer 30 in the third direction z to expose the source electrode 273 covered by the third insulating layer 30.

The second electrode layer 31 is disposed on the side of the first electrode layer 29 away from the second insulating layer 28. In the embodiment of the present application, the second electrode layer 31 is disposed on the third insulating layer 30. The second electrode layer 31 includes a plurality of patterned second electrodes 310, which are pixel electrodes. Each of the second electrode 310 is connected to the source electrode 273 through the sixth via hole 301 to be charged through the source electrode 273 and the data signal line 272, so as to form an electric field with the first electrode 291 to drive liquid crystals in the display panel to deflect.

Referring to FIG. 2 and FIG. 3, in the embodiment of the present application, the array substrate 200 further includes a first area A1 and a second area A2 surrounding the first area A1. The first area A1 is a display area, the sub-pixel units P are all arranged in the first area A1, and the second area A2 is a non-display area. The array substrate 200 further includes a common voltage signal line 275 disposed on an outer periphery of the first area A1 and surrounds the first area A1.

In the embodiment of the present application, the common voltage signal line 275 is disposed on the second metal layer 27 and is configured to transmit the common voltage signal required by the first electrode 291. The first insulating layer 26 is further provided with a plurality of third via holes 262 extending through the first insulating layer 26 in the third direction z. The third via holes 262 are also arranged on an opposite side of the first area A1. Opposite ends of the common signal line 250 are respectively connected to the common voltage signal line 275 through the third via holes 262, so that the common voltage signal can be quickly and evenly transmitted to the first electrode 291.

Further, the second insulating layer 28 is further provided with a plurality of seventh via holes 283 extending through the second insulating layer 28 in the third direction z, and the seventh via holes 283 expose the common voltage signal line 275. The seventh via holes 283 are located on the outer periphery of the first area A1. The first electrode 293 can be connected to the common voltage signal line 275 through the seventh via holes 283, so that the common voltage signal can be further quickly and evenly transmitted to the first electrode 291, thereby improving a problem of display unevenness for medium and large-sized display panels.

An orthographic projection of at least one of the second via hole 281 or the second electrode 310 on the substrate 20 is staggered from an orthographic projection of the first via hole 261 on the substrate 20. In this way, the third insulating layer 30 between the first electrode layer 29 and the second electrode layer 31 can be prevented from cracking; alternatively, even if a crack occurs in the third insulating layer between the first electrode layer 29 and the second electrode layer 31, the second electrode 310 does not exist above the first electrode 291 deposited through the crack, thereby preventing a short from occurring between the first electrode 291 and the second electrode 310. In this manner, it solves a problem of abnormal display, such as clusters of dark spots or horizontal lines during a lighting test of the array substrate and the electronic device, thereby improving a yield of the array substrate.

An orthographic projection of the first via hole 261 on the substrate 20 and an orthographic projection of the second via hole 281 on the substrate 20 are completely staggered from each other.

In one embodiment, as shown in FIG. 3, the conductive electrode 271 includes a body portion 271a and an extension portion 271b. The body portion 271a is formed in the first via hole 261 and is distributed on a bottom and an inner wall of the first via hole 261. The extension portion 271b is connected to the body portion 271a and is formed on the side of the first insulating layer 26 away from the first metal layer 25. Since the orthographic projection of the second via hole 281 on the substrate 20 does not overlap with the orthographic projection of the first via hole 261 on the substrate 20, the second insulating layer 28 can cover the body portion 271a and fill a recessed area formed by the first via hole 261. The second insulating layer 28 may also cover the extension portion 271b and fill the first via hole 261. The second via hole 281 in the second insulating layer 28 exposes a part of the extension portion 271b, so that the first electrode 291 is connected to the extension portion 271b through the second via hole 281.

In the embodiment of the present application, a thickness of the second insulating layer 28 is 2.5 micros (μm). In practical applications, the thickness of the second insulating layer 28 is not limited to 2.5 μm, but may also be 2 μm, 2.3 μm, 2.7 μm, or 3 μm.

It should be noted that the use of the second insulating layer 28 to fill the recessed area formed by the first via hole 261 can make each of the first electrode layer 29, the third insulating layer 30, and an area corresponding to the first via hole 261 that are subsequently formed on the second insulating layer 28 to form a flat surface, thereby preventing the first electrode layer 29 and the third insulating layer 30 from being in a direct contact with a step corner of the first insulating layer 26 in the first via hole 261. In this manner, an extent of the first electrode layer 29 and the third insulating layer 30 which are squeezed by the melted conductive electrode 271 due to electrostatic discharge can be reduced, so that a risk of cracks in the third insulating layer 30 is lowered, thereby effectively preventing a short from occurring between the first electrode 291 and the second electrode 310.

Further, the orthographic projection of the first via hole 261 on the substrate 20 and the orthographic projection of the second via hole 281 on the substrate 20 at least partially overlap.

Figure 4:
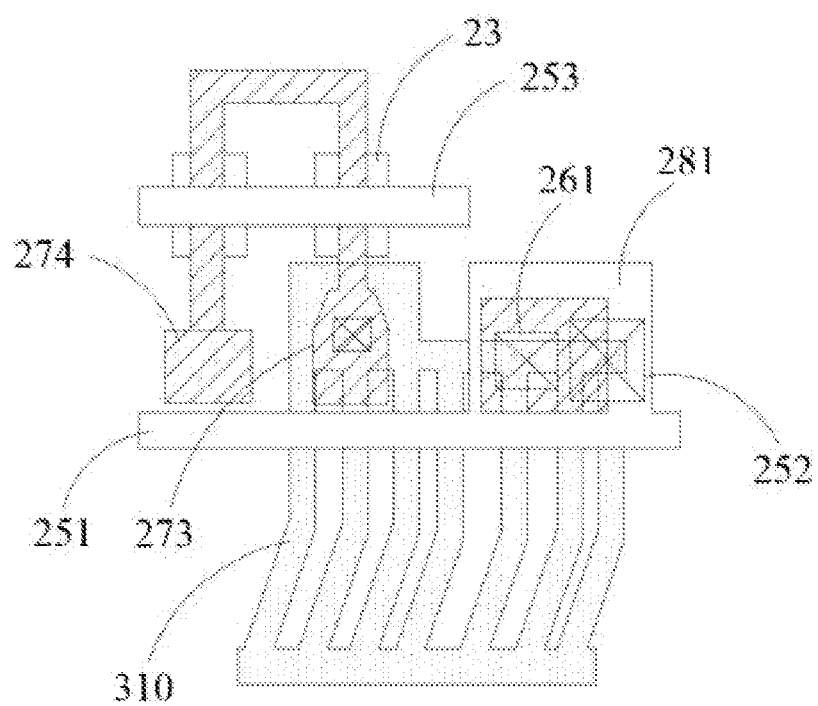
FIG. 4 is a schematic partial enlarged view of the first type of the array substrate provided by an embodiment of the present application.

In one embodiment, referring to FIG. 3 in combination with FIG. 4, FIG. 4 is a schematic partial enlarged view of the first type of the array substrate provided by an embodiment of the present application. The orthographic projection of the first via hole 261 on the substrate 20 does not overlap with the orthographic projection of the second via hole 281 on the substrate 20, and the orthographic projection of the first via hole 261 on the substrate 20 partially overlaps an orthographic projection of the second electrode 310 on the substrate 20. The orthographic projection of the second via hole 281 on the substrate 20 partially overlaps the orthographic projection of the second electrode 310 on the substrate 20. In practical applications, the orthographic projection of the second electrode 310 on the substrate 20 can also completely cover the orthographic projection of the second via hole 281 on the substrate 20.

Figure 5:
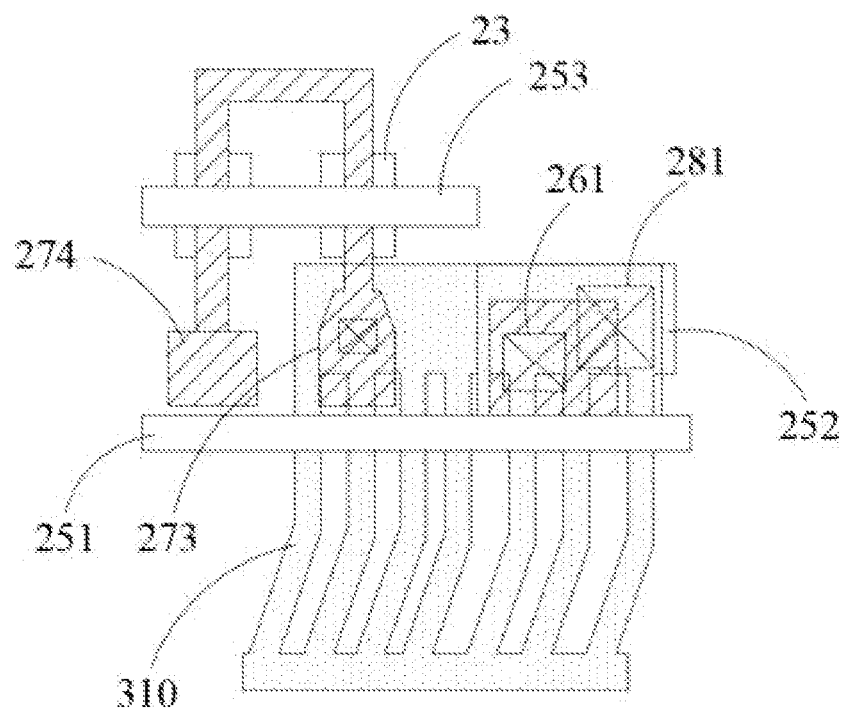
FIG. 5 is a schematic partial enlarged view of a second type of an array substrate provided by an embodiment of the present application.

In one embodiment, as shown in FIG. 5, which is a schematic partial enlarged view of a second type of an array substrate provided by an embodiment of the present application, the orthographic projection of the first via hole 261 on the substrate 20 does not overlap with the orthographic projection of the second via hole 281 on the substrate 20. The orthographic projection of the second electrode 310 on the substrate 20 completely covers the orthographic projection of the first via hole 261 on the substrate 20. In addition, the orthographic projection of the second electrode 310 on the substrate 20 also completely covers the orthographic projection of the second via hole 281 on the substrate 20. In practical applications, the orthographic projection of the second via hole 281 on the substrate 20 may also partially overlap the orthographic projection of the second electrode 310 on the substrate 20.

Figure 6:
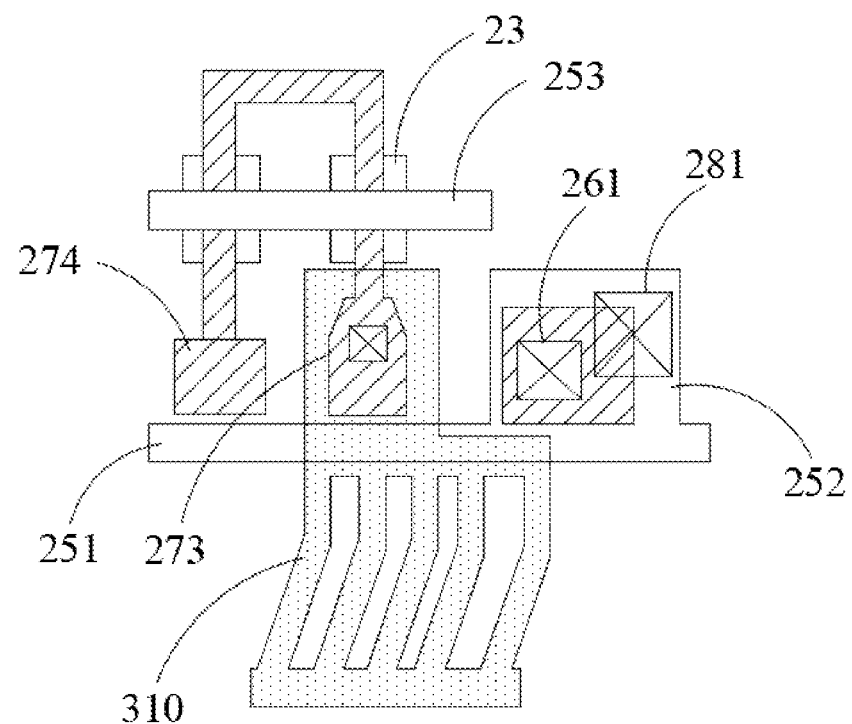
FIG. 6 is a schematic partial enlarged view of a third type of an array substrate provided by an embodiment of the present application.

In one embodiment, as shown in FIG. 6, which is a schematic partial enlarged view of the third type of the array substrate provided by the embodiment of the present application. The orthographic projection of the first via hole 261 on the substrate 20 does not overlap with the orthographic projection of the second via hole 281 on the substrate 20. The orthographic projection of the first via hole 261 on the substrate 20 and the orthographic projection of the second electrode 310 on the substrate 20 are completely staggered from each other and do not overlap with each other. In addition, the orthographic projection of the second via hole 281 on the substrate 20 and the orthographic projection of the second electrode 310 on the substrate 20 are also completely staggered from each other. In practical applications, the orthographic projection of the second electrode 310 on the substrate 20 may also partially overlap the orthographic projection of the second via hole 281 on the substrate 20, or completely cover the orthographic projection of the second via hole 281 in the third direction z.

It can be understood that in the above embodiments, since the orthographic projections of the first via hole 261 and the second via hole 281 on the substrate 20 are completely staggered from each other, the second insulating layer 28 can be used to fill the recessed area formed by the first via hole 261, so that each film layer above the first via hole 261 is configured with a flat surface. Therefore, even if the second electrode 310 is not provided above the first via hole 261 and the second via hole 281, or a part of the second electrode 310 is provided, or the second electrode 310 completely covers the first via hole 261 and the second via hole 281, a problem of an electrical short between the first electrode 291 and the second electrode 310 will not be created. If the orthographic projection of the second electrode 310 partially overlaps or completely covers the orthographic projection of the first via hole 261 and/or the second via hole 281, an area of the second electrode 310 will not be affected to be smaller due to the staggered arrangement of the first via hole 261 and the second via hole 281, thereby ensuring an aperture ratio of each sub-pixel in the array substrate 200.

In another embodiment, the orthographic projection of the first via hole 261 on the substrate and the orthographic projection of the second via hole 281 on the substrate at least partially overlap, and the orthographic projection of the first via hole 261 on the substrate and the orthographic projection of the second electrode 310 on the substrate are completely staggered from each other.

Figure 7:
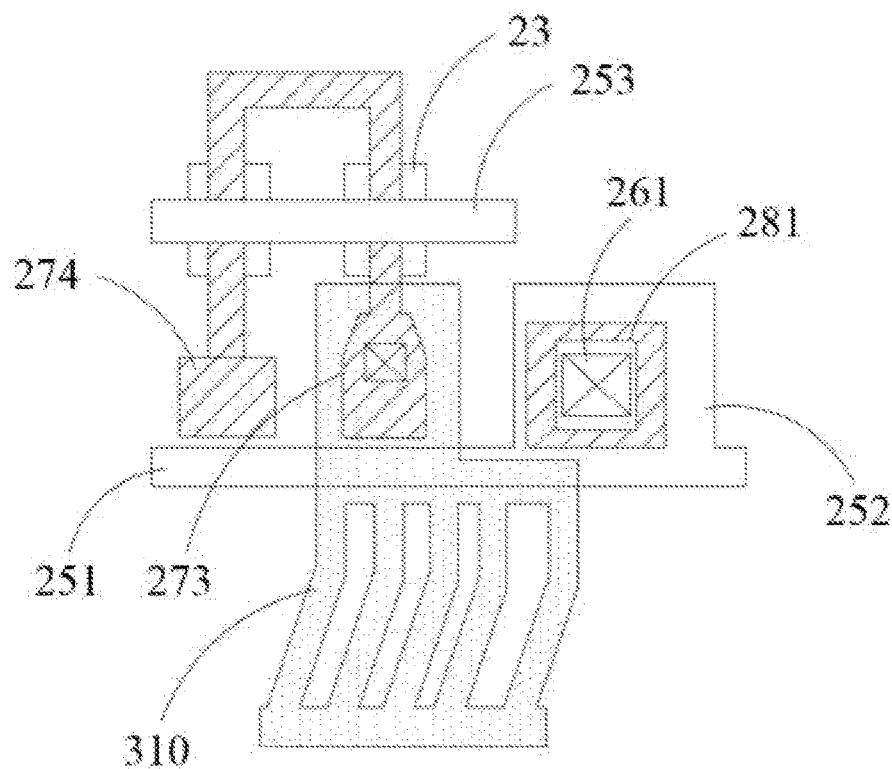
FIG. 7 is a schematic partial enlarged view of a fourth type of an array substrate provided by an embodiment of the application.

Specifically, further referring to FIG. 7, which is a schematic partial enlarged view of the fourth type of the array substrate provided by an embodiment of the application, the orthographic projection of the second electrode 310 on the substrate 20 and the orthographic projection of the first via 261 on the substrate 20 are completely staggered from each other and do not overlap. The orthographic projection of the second electrode 310 on the substrate 20 and the orthographic projection of the second via hole 281 on the substrate 20 are also completely staggered from each other. In this way, the first via hole 261 can be filled with the second insulating layer 28, thereby reducing the risk of cracks in the third insulating layer 30 located above the first via hole 261, and preventing a short from occurring between the first electrode 291 and the second electrode 310.

Figure 8:
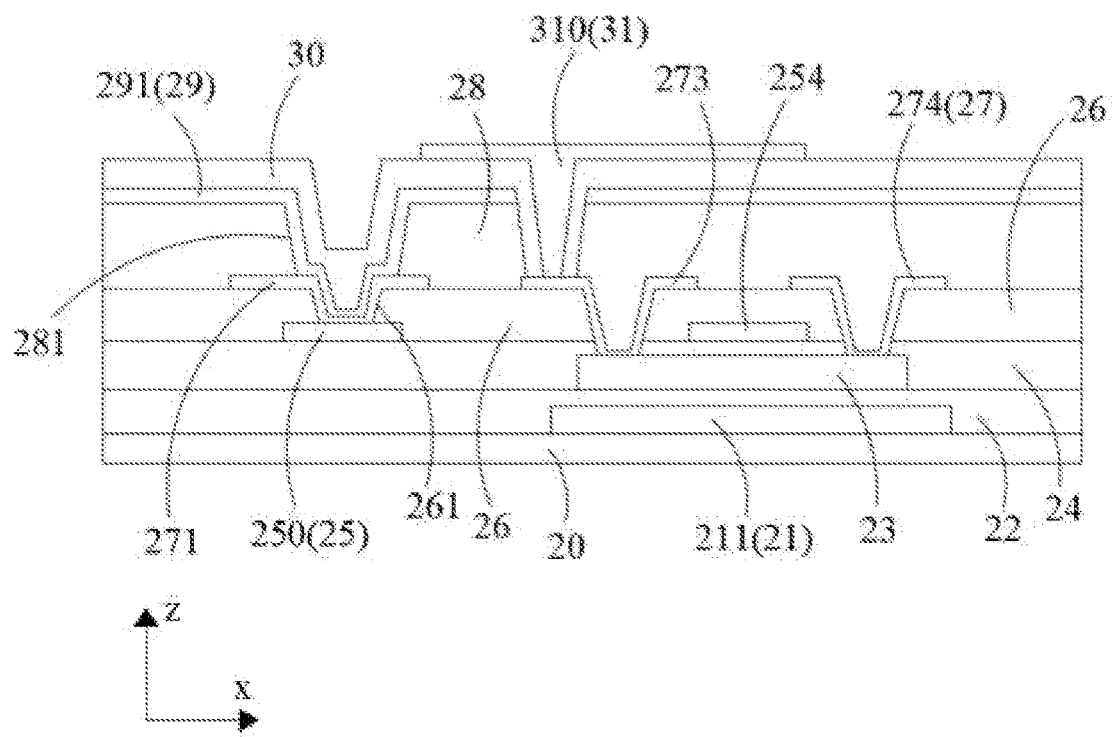
FIG. 8 is a schematic cross-sectional view of the fourth type of the array substrate taken along line A-A provided by an embodiment of the present application.

As shown in FIG. 8, which is a schematic cross-sectional view of the fourth type of the array substrate taken along line A-A provided by the embodiment of the present application, the second via hole 281 is directly laminated on the first via hole 261, and the orthographic projection of the second via hole 281 in the third direction z completely covers the orthographic projection of the first via hole 261 in the third direction z. Compared with the staggered arrangement of the first via hole 261 and the second via hole 281, by directly locating the second via hole 281 on the first via hole 261, a plane area occupied by the first via hole 261 and the second via hole 281 can be reduced.

Figure 9:
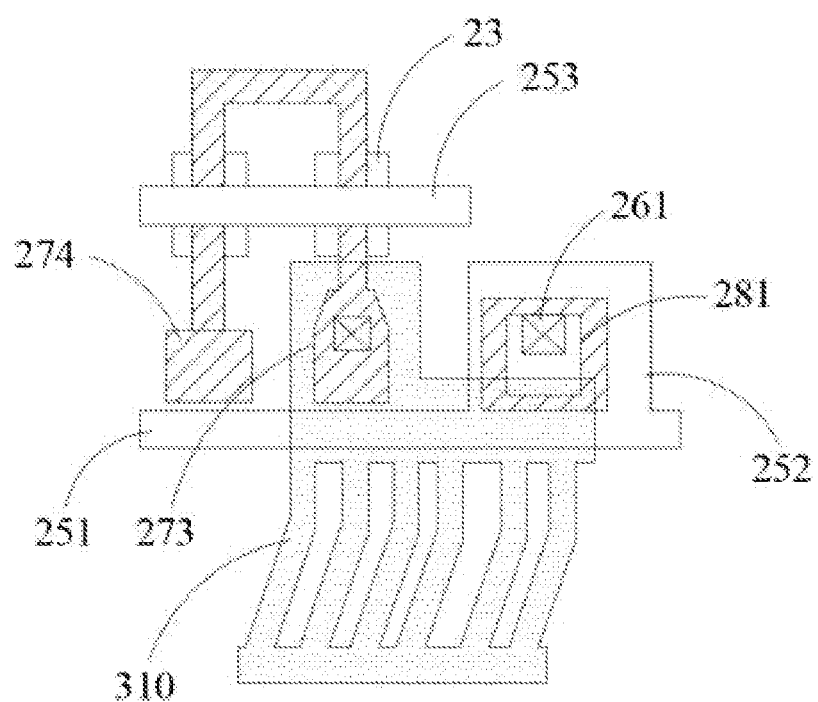
FIG. 9 is a schematic partial enlarged view of a fifth type of an array substrate provided by an embodiment of the present application.

In another embodiment, as shown in FIG. 9, which is a schematic partial enlarged view of a fifth type of the array substrate provided by the embodiment of the present application. In order to prevent the provision of the first via hole 261 and the second via hole 281 from taking up an area configured for the second electrode 310, the orthographic projection of the second electrode 310 on the substrate 20 can partially overlap the orthographic projection of the second via hole 281 on the substrate 20, and the orthographic projection of the second via hole 281 on the substrate 20 and the orthographic projection of the first via hole 261 on the substrate 20 are completely staggered from each other. In this way, not only can a short between the first electrode 291 and the second electrode 310 be prevented, but also a decrease in the area for the second electrode 310 due to the provision of the first via hole 261 and the second via hole 281 be prevented.

The embodiments of the present application have advantageous effects as follows: the embodiments of the present application provide an array substrate and an electronic device. The electronic device includes the array substrate. The array substrate includes a substrate, a first metal layer, a first insulating layer, a second metal layer, a second insulating layer, a first electrode layer, and a second electrode layer all sequentially stacked. The first metal layer includes a plurality of common signal lines, and the first insulating layer covers the first metal layer. A plurality of first via holes are formed in the first insulating layer. The second metal layer is arranged on a side of the first insulating layer away from the first metal first electrode layer and includes a plurality of conductive electrodes. The conductive electrodes are connected to the common signal lines through the first via holes. The second insulating layer is disposed on the side of the first insulating layer away from the first metal layer and covers the second metal layer, and a plurality of second via holes are formed in the second insulating layer. The first electrode layer is disposed on a side of the second insulating layer away from the second metal layer and includes a first electrode. The first electrode is connected to the conductive electrodes through the second via holes. The second electrode layer is disposed on a side of the first electrode layer away from the second insulating layer and includes a second electrode. An orthographic projection of at least one of the second via hole or the second electrode on the substrate is staggered from an orthographic projection of the first via hole on the substrate, thereby preventing cracks from occurring in an insulating layer between the first electrode layer and the second electrode layer, or ensuring that the second electrode would not occur above the first electrode precipitated through the cracks between the first electrode layer and the second electrode layer, so that a short circuit between the first electrode and the second electrode can be prevented.

Accordingly, although the preferred embodiments of this application are disclosed as above, the above preferred embodiments are not intended to limit the application. Those of ordinary skill in the art can make various changes and modifications without departing from the scope of this application. Therefore, the scope of protection of this application is based on the scope defined by the claims.

What is claimed is:
1. An array substrate, comprising:
a substrate;
a first metal layer disposed on the substrate and comprising a plurality of common signal lines;
a first insulating layer covering the first metal layer and provided with a plurality of first via holes;
a second metal layer disposed on a side of the first insulating layer away from the first metal layer and comprising a plurality of conductive electrodes, wherein the conductive electrodes are connected to the common signal lines through the first via holes;

a second insulating layer disposed on the side of the first insulating layer away from the first metal layer and covering the second metal layer, and a plurality of second via holes defined on the second insulating layer;

a first electrode layer disposed on a side of the second insulating layer away from the second metal layer and comprising a plurality of first electrodes, wherein the first electrodes are connected to the conductive electrodes through the second via holes;

a second electrode layer disposed on a side of the first electrode layer away from the second insulating layer and comprising a plurality of second electrodes;

wherein an orthographic projection of at least one of the second via hole or the second electrode on the substrate is staggered from an orthographic projection of the first via hole on the substrate.

2. The array substrate of claim 1, wherein the orthographic projection of the first via hole on the substrate and the orthographic projection of the second via hole on the substrate are completely staggered from each other, and the orthographic projection of the first via hole on the substrate and the orthographic projection of the second electrode on the substrate at least partially overlap.

3. The array substrate of claim 2, wherein the orthographic projection of the second via hole on the substrate and the orthographic projection of the second electrode on the substrate are completely staggered from each other or at least partially overlap.

4. The array substrate of claim 2, wherein each of the conductive electrodes comprises:

a body portion disposed in the first via hole and connected to one of the common signal lines, wherein the second insulating layer covers the body portion and fills the first via hole; and an extension portion connected to the body portion and disposed on the side of the first insulating layer away from the first metal layer, wherein the second via hole exposes the extension portion, and the first electrode is connected to the extension portion.

5. The array substrate of claim 1, wherein the orthographic projection of the first via hole on the substrate and the orthographic projection of the second via hole on the substrate are completely staggered from each other, and the orthographic projection of the first via hole on the substrate and the orthographic projection of the second electrode on the substrate are completely staggered from each other.

6. The array substrate of claim 5, wherein the orthographic projection of the second via hole on the substrate and the orthographic projection of the second electrode on the substrate are completely staggered from each other or at least partially overlap.

7. The array substrate of claim 5, wherein each of the conductive electrodes comprises:

a body portion disposed in the first via hole and connected to one of the common signal lines, wherein the second insulating layer covers the body portion and fills the first via hole; and an extension portion connected to the body portion and disposed on the side of the first insulating layer away from the first metal layer, wherein the second via hole exposes the extension portion, and the first electrode is connected to the extension portion.

8. The array substrate of claim 1, wherein the orthographic projection of the first via hole on the substrate and the orthographic projection of the second via hole on the substrate at least partially overlap, and the orthographic projection of the first via hole on the substrate and the orthographic projection of the second electrode on the substrate are completely staggered from each other.

9. The array substrate of claim 8, wherein the orthographic projection of the second via hole on the substrate and the orthographic projection of the second electrode on the substrate are completely staggered from each other or at least partially overlap.

10. The array substrate of claim 1, wherein the array substrate comprises a first area, and the second electrodes are arranged in an array in the first area;

wherein the second metal layer comprises a common voltage signal line, and the common voltage signal line surrounds an outer periphery of the first area and is connected to the common signal lines through a plurality of third via holes extending through the first insulating layer.

11. The array substrate of claim 10, further comprising a plurality of gate signal lines and a plurality of data signal lines;

wherein the common signal lines and the gate signal lines are disposed in a same layer, and the common voltage signal line and the data signal lines are disposed in a same layer.

12. An electronic device, comprising a display panel, the display panel comprising an array substrate, and the array substrate comprising:

a substrate;

a first metal layer disposed on the substrate and comprising a plurality of common signal lines;

a first insulating layer covering the first metal layer and provided with a plurality of first via holes;

a second metal layer disposed on a side of the first insulating layer away from the first metal layer and comprising a plurality of conductive electrodes, wherein the conductive electrodes are connected to the common signal lines through the first via holes;

a second insulating layer disposed on the side of the first insulating layer away from the first metal layer and covering the second metal layer, and a plurality of second via holes defined on the second insulating layer;

a first electrode layer disposed on a side of the second insulating layer away from the second metal layer and comprising a plurality of first electrodes, wherein the first electrodes are connected to the conductive electrodes through the second via holes;

a second electrode layer disposed on a side of the first electrode layer away from the second insulating layer and comprising a plurality of second electrodes;

wherein an orthographic projection of at least one of the second via hole or the second electrode on the substrate is staggered from an orthographic projection of the first via hole on the substrate.

13. The electronic device of claim 12, wherein the orthographic projection of the first via hole on the substrate and the orthographic projection of the second via hole on the substrate are completely staggered from each other, and the orthographic projection of the first via hole on the substrate and the orthographic projection of the second electrode on the substrate at least partially overlap.

14. The array substrate of claim 13, wherein the orthographic projection of the second via hole on the substrate and the orthographic projection of the second electrode on the substrate are completely staggered from each other or at least partially overlap.

15. The electronic device of claim 13, wherein each of the conductive electrodes comprises:

a body portion disposed in the first via hole and connected to one of the common signal lines, wherein the second insulating layer covers the body portion and fills the first via hole; and an extension portion connected to the body portion and disposed on the side of the first insulating layer away from the first metal layer, wherein the second via hole exposes the extension portion, and the first electrode is connected to the extension portion.

16. The electronic device of claim 12, wherein the orthographic projection of the first via hole on the substrate and the orthographic projection of the second via hole on the substrate are completely staggered from each other, and the orthographic projection of the first via hole on the substrate and the orthographic projection of the second electrode on the substrate are completely staggered from each other.

17. The electronic device of claim 16, wherein the orthographic projection of the second via hole on the substrate and the orthographic projection of the second electrode on the substrate are completely staggered from each other or at least partially overlap.

18. The electronic device of claim 16, wherein each of the conductive electrodes comprises:

a body portion disposed in the first via hole and connected to one of the common signal lines, wherein the second insulating layer covers the body portion and fills the first via hole; and an extension portion connected to the body portion and disposed on the side of the first insulating layer away from the first metal layer, wherein the second via hole exposes the extension portion, and the first electrode is connected to the extension portion.

19. The electronic device of claim 12, wherein the orthographic projection of the first via hole on the substrate and the orthographic projection of the second via hole on the substrate at least partially overlap, and the orthographic projection of the first via hole on the substrate and the orthographic projection of the second electrode on the substrate are completely staggered from each other.

20. The electronic device of claim 19, wherein the orthographic projection of the second via hole on the substrate and the orthographic projection of the second electrode on the substrate are completely staggered from each other or at least partially overlap.

* * * * *